United States Patent [19]

Moutou et al.

[11] 4,097,142
[45] Jun. 27, 1978

[54] OPTICAL PATTERN TRACER

[75] Inventors: Paul Cyril Moutou; Michel Hareng; Serge Le Berre, all of Paris, France

[73] Assignee: Thomson-CSF, Paris, France

[21] Appl. No.: 750,456

[22] Filed: Dec. 14, 1976

[30] Foreign Application Priority Data

Dec. 19, 1975 France .................................. 75 39184

[51] Int. Cl.² ....................... G03B 29/00; G03B 27/70
[52] U.S. Cl. ........................................... 355/45; 354/4
[58] Field of Search ................. 355/18, 8, 32, 77, 3 R, 355/48-51, 133, 20, 66, 44, 45, 53; 354/4

[56] References Cited

U.S. PATENT DOCUMENTS

| | | |
|---|---|---|
| 3,573,849 | 4/1971 | Herriot et al. ......................... 354/4 X |
| 3,584,949 | 6/1971 | Clow ....................................... 355/45 |
| 3,648,583 | 3/1972 | Blattner ................................... 354/4 |
| 3,704,946 | 12/1972 | Brault et al. ......................... 355/53 X |
| 3,732,796 | 5/1973 | Marcy ..................................... 354/4 |
| 3,764,211 | 10/1973 | Morse et al. ....................... 355/20 X |

Primary Examiner—Donald A. Griffin
Attorney, Agent, or Firm—Cushman, Darby & Cushman

[57] ABSTRACT

This invention relates to apparatus for automatically tracing patterns under the control of a program recorded in a computer. Said apparatus comprises means for initially recording the pattern in a liquid crystal cell by a known method under the control of said computer, and means for projecting the pattern thus recorded onto a photosensitive surface which records it on a reduced scale. It may also be projected on a large scale onto a monitor screen.

4 Claims, 1 Drawing Figure

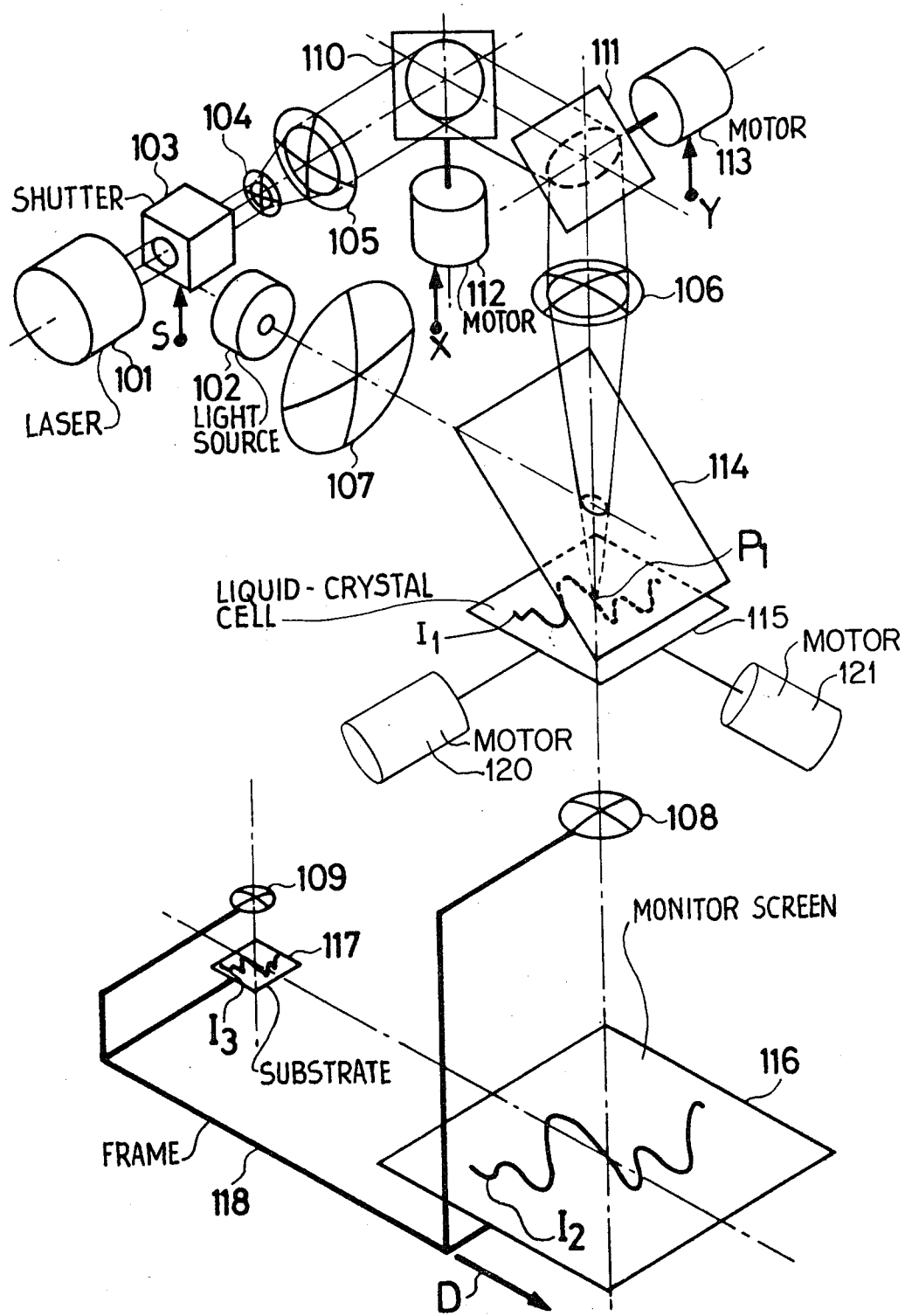

OPTICAL PATTERN TRACER

This invention relates to optical pattern tracers. The patterns thus traced are generally used as masks for the production of integrated circuits.

It is known that masks of this type can be produced by drawing them to a large scale, for example on sensitised paper, followed by photographic reduction. In most cases, this photographic reduction step is carried out twice, the mask thus obtained being used in contact with a substrate coated with photosensitive resin to transfer the required pattern thereto. This transfer may also be carried out optically by placing the substrate thus coated in the photographic reduction apparatus in place of the mask obtained by the first process.

These processes are laborious and expensive and the retouching work necessary accentuates these disadvantages.

Subsequently, attempts were made to trace the required pattern directly onto the resin with which the substrate is coated, by using an apparatus derived from the electron scanning microscope and known as an electronic masker. The deviation of the electron beam in this apparatus is controlled by an electronic computer containing a program which defines the pattern. Such an apparatus is described in U.K. Pat. No. 1,407,517 patented on Jan. 21, 1976.

However, these apparatus are complex and relatively delicate to use, particularly on account of the powerful vacuum which has to be maintained in them. They are used above all in cases where it is necessary to obtain a sharpness of the pattern which it is not possible to achieve with optical means on account of the diffraction phenomena.

In accordance with the present invention, it is provided an apparatus for tracing under the control of a set of external control signals a pattern onto a substrate coated with a photo sensitive product, which comprises:
  a liquid crystal cell;
  means for recording an enlarged copy of said pattern onto said cell under the control of said external control signals; and
  first means for optically projecting said enlarged copy on a reduced scale onto said substrate.

For a better understanding of the invention, and to show how the same may be carried into effect, reference will be made to the ensuing description and to the attached FIGURE which illustrate a schematic embodiment of a tracer according to the invention.

The tracer shown in the FIGURE, comprises two light sources 101 and 102, a shutter 103, six lenses 104 to 109, two rotating mirrors 110 and 111, 2 motors 112 and 113, a semitransparent mirror 114, a liquid crystal cell 115 and a monitor screen 116.

The light source 101, for example a carbon dioxide laser, emits a parallel beam of light comprising a great amount of infrared radiations. This beam is intercepted by the optical interrupter 103, which can stop it or allow it through, under the action of a first control signal delivered through the connection S. The lenses 104 and 105 merely perform the well known function of beam enlarger so as to limit the effect of diffraction.

The beam issuing from the shutter 103 and the lenses 104 and 105 is deflected by the rotating mirrors 110 and 111 of which the axes of rotation are perpendicular. These mirrors are rotated by the motors 112 and 113, respectively. The motors operate in response to a second and a third control signals delivered to them through connections X and Y.

The beam deflected by the mirror 111 is focused by a projection lens, diagrammatically represented by the lens 106, at a point $P_1$ of the active layer of the liquid crystal cell 115 after having passed through the semitransparent mirror 114.

This point $P_1$ appears depending on whether the shutter 103 is open or closed and moves according to the rotation of the mirrors 110 and 111, thus tracing the desired pattern, for example $I_1$ in the FIGURE. The mechanical/optical deflecting means thus used are particularly well suited to the low response speed of the liquid crystal cells which do not necessitate the use of particularly fast deflectors. The control signals applied to the interrupter 103 and to the motors 112 and 113 come from an external electronic computer which is programmed according to a well known method to the pattern to be obtained. In this particular respect, the technique is very comparable with that used in the electronic maskers such as that described in "Revue Technique THOMSON-CSF", Vol. 5, No. 4, December 1973, the control signals being fitted for controlling motors instead of electron beam deviators.

The various methods of recording an image in a liquid crystal cell are themselves well known and are described particularly in French Patent Application No. 74.42. 640. In the method used in this example, the liquid crystal, which initially is in an organized smectic state, is brought to the point of impact of the infrared beam in the liquid state by the heat present in that beam and, by cooling, reassumes a disorganized smectic form which is diffusing, while the organized smectic form is transparent.

One important characteristic of this method is that parts of the image obtained can be selectively erased by passing the infrared beam back over these parts and by subjecting the film to a voltage which reorients the crystal causing its return to the smectic phase.

By acting on the various parameters which may be used, it is possible to obtain numerous variants of the recording methods and these variants may give rise to as many different embodiments of the pattern tracer without departing from the scope defined by the subject of the invention.

One of these variants consists in applying to the cell 115 the control signal now applied to the shutter 103 so as to control a voltage applied to that cell. Thus, when this voltage is at the value used for selective erasing, there is in fact no recording despite the passage of the infrared beam. Accordingly, this enables the beam to be left permanently intact so that the shutter 103 may be cancelled.

The light source 102, comparable with a spot source, emits a divergent light beam represented only by its axis. This beam is intercepted by the lens 107 acting as a condenser and illuminates the cell 115 by way of the mirror 114. This beam is filtered to eliminate the long-wave radiations so as not to influence the cell 115 and not erase the pattern writted in.

It is possible for this purpose to use as the mirror 114 a dichroic mirror which transmits the red and reflects the blue.

A projection lens, represented diagrammatically by the lens 108, projects an enlarged image $I_2$ of the pattern $I_1$ on the monitor screen 116. In the illustrated embodiment, this image is black on white background because the lines of the image $I_1$ are difusing, although this contrast may readily be inverted by using the Schlieren method which consists in eliminating the zero diffraction order by placing a masking screen at the image focusing point of the lens 103. This inversion of contrast is accompanied by an increase in its absolute value which is particularly favourable to the photographic process subsequently used. In any event, the nature of the final contrast will be selected, for a given configuration of the tracer, by a subsequent programming of the computer controlling the recording on the cell 115.

It is then sufficient to observe the screen 116 to monitor the image recorded on the cell 115 at any instant and, in particular, during recording. This monitoring is of little intrest during the initial tracing of a complete mask as soon as it is a bit complex because it is easy to become lost in the wealth of detail, but such a monitoring assumes its full effect when observing the correction of a mask which has been used for example for obtaining an integrated circuit whose performance it is desired to improve, because it is possible in this case to concentrate attention on those places which are suspected of being faulty and carefully to observe the correcting operations which, in general, are limited to a well defined portion of the pattern.

On completion of recording of the pattern in the cell 115, the lens 108 is replaced by a projection lens represented diagrammatically by the lens 109, and the screen 116 by a substrate 117 coated with photosensitive resin. To this end, it is convenient to fix the lenses 108 and 109, the screen 116 and the substrate 117 to one and the same frame represented diagrammatically by the part 118 and to move this frame in the direction D.

During this movement, the light source 102 is of course blanked out. When the lens 109 and the substrate 117 are in place, the source 102 is brought into service again and the lens 109 forms the reduced image $I_3$ of the pattern $I_1$ on the substrate 117. This image is recorded on the photosensitive resin covering the substrate which is then treated in the usual way.

The substrate 117 may of course be replaced by a photographic plate which will then act as a mask for reproducing the pattern thus obtained by direct printing. In this case, it is of particular advantage to touch up the various patterns which it is desired to obtain by directly transferring the image to the resin in the tracer by the method described above. It is thus possible to eliminate the photographic transfer step which is unnecessarily long for a single production such as that used for touching up. On completion of touching up, the image is formed on a photographic plate instead of a substrate for obtaining a master mask. If necessary, the pattern may be repetitively reproduced by displacing this plate step-by-step on the support 118.

Allowing for the present technological limitations of liquid crystal cells, it was possible to produce an apparatus provided with an active surface measuring 20 × °mm². The tracer records a pattern in this cell in the space of a few minutes, this period being essentially dependent upon the complexity of the pattern and being essentially limited by the recording rate of the cell which is of the order of 5 cm/s. The definition of the lines of the pattern is substantially 20 $\mu$ and the positioning precision 3 $\mu$.

The lens 108 enables this pattern to be enlarged 40 times which, on the screen 116, gives 0.8 mm wide lines which are thus perfectly legible.

The lens 109 enables this pattern to be reduced 20 times which, on the substrate 117, gives 1 $\mu$ wide lines substantially corresponding to the maximum possible limit in optical processes. The contrast obtained on projection is approximately 20/1 which is perfectly suitable for exposing the resins commonly used.

Under these conditions, the pattern thus traced is contained after development in a 1 × 1 mm² frame and the limiting resolution is 0.5 $\mu$.

It would be desirable to be able to obtain masks covering a larger surface area, but in this case the embodiment described above would lead to excessive aberrations due to the excessive deflection angles obtained with the mirrors 110 and 111. In that case, mechanical displacement of the cell 115 by motors 120 and 121 may be contemplated.

One simple solution is to record the pattern solely by displacing this cell, thereby eliminating the action of the movable mirrors. In this case, it is difficult to obtain uniform displacement and it is preferred to displace the cell step-by-step in two perpendicular directions so as to bring to each step a blank zone which is recorded in the same way as described above, the pattern being obtained in the form of a series of juxtaposed squares.

This latter method is very similar to that used in an electronic masker, but in view of the distinctly lower precision to be obtained by virtue of the larger scale used, it is not necessary to measure the position of the cell by interferomerty, which represents a condsiderable simplification.

The following is a list of the references cited by the French patent office:
U.S. Pat. No. 3,732,796 (MARCY)
French Pat. No. 2030 468 (THOMSON-CSF)
French Pat. No. 2179 632 (SESCOSEM)
French Patent No. 2191 805 (WESTERN ELECTRIC)
French Application No. 2182 582 (THOMSON-CSF)

What we claim is:
1. An apparatus for tracing under the control of a set of external control signals a pattern onto a substrate coated with a photo-sensitive product, which comprises:
 a liquid crystal cell;
 means for recording an enlarged copy of said pattern onto said cell under the control of said external control signals; said recording means comprising a light source for emitting a beam comprising substantially infrared radiations, means for deflecting said beam along two seaprate directions, delivering a deflected beam, means for focusing said deflected beam onto said cell, and means for occulating said beam;
 first means for optically projecting said enlarged copy on a reduced scale onto said substrate;
 a monitoring screen; and
 second means for optically projecting said enlarged copy on a far more enlarged scale onto said monitoring screen; said substrate said monitoring screen, and said first and second projecting means being secured to a frame movable between a monitoring position and a tracing position.

2. An apparatus as claimed in claim 1, further comprising means for applying to said liquid-crystal cell a reorienting voltage for selectively erasing said enlarged copy.

3. An apparatus as claimed in claim 1, further comprising, said pattern being divided into a plurality of adjacent zones, means for displacing said liquid-crystal cell-step-by-step for successively recording said adjacent zones.

4. An apparatus as claimed in claim 1, further comprising means for displacing said substrate step-by-step for successively projecting said enlarged copy onto a pluraty of separate areas of said substrate.

* * * * *